United States Patent
Wang

(10) Patent No.: US 10,761,148 B2
(45) Date of Patent: *Sep. 1, 2020

(54) INDICATING CIRCUIT FOR SWITCHING POWER SUPPLY AND USE METHOD THEREOF

(71) Applicant: MORNSUN GUANGZHOU SCIENCE & TECHNOLOGY CO., LTD., Guangzhou, Guangdong (CN)

(72) Inventor: Baojun Wang, Guangdong (CN)

(73) Assignee: MORNSUN GUANGZHOU SCIENCE & TECHNOLOGY CO., LTD., Guangzhou, Guangdong (CN)

( * ) Notice: Subject to any disclaimer, the term of this patent is extended or adjusted under 35 U.S.C. 154(b) by 212 days.

This patent is subject to a terminal disclaimer.

(21) Appl. No.: 16/070,291

(22) PCT Filed: Aug. 23, 2016

(86) PCT No.: PCT/CN2016/096354
§ 371 (c)(1),
(2) Date: Jul. 16, 2018

(87) PCT Pub. No.: WO2017/124742
PCT Pub. Date: Jul. 27, 2017

(65) Prior Publication Data
US 2019/0025363 A1    Jan. 24, 2019

(30) Foreign Application Priority Data

Jan. 21, 2016    (CN) .......................... 2016 1 0040378

(51) Int. Cl.
*G01R 31/64*    (2020.01)
*H05B 45/37*    (2020.01)
(Continued)

(52) U.S. Cl.
CPC ............ *G01R 31/64* (2020.01); *G01R 31/003* (2013.01); *G05F 1/565* (2013.01); *H01H 9/161* (2013.01);
(Continued)

(58) Field of Classification Search
CPC ...... G01R 31/64; G01R 31/003; G01R 31/40; G01R 19/16533; G01R 31/00; H05B 45/37; G05F 1/565; H01H 9/161
See application file for complete search history.

(56) References Cited

U.S. PATENT DOCUMENTS 4,581,494 A * 4/1986 Pickens ................... H04M 3/30
                                                                        379/22
4,819,144 A * 4/1989 Otake ............... H02M 3/33507
                                                                        363/131
(Continued)

FOREIGN PATENT DOCUMENTS

CN    201654164    11/2010
CN    102914714    2/2013
(Continued)

OTHER PUBLICATIONS

Afroz M. Imam, Condition Monitoring of Electrolytic Capacitors for Power Electronics Applications, Dissertation, Georgia Institute of Technology, 2007 (Year: 2007).*

(Continued)

*Primary Examiner* — Daniel R Miller
(74) *Attorney, Agent, or Firm* — JCIPRNET

(57) ABSTRACT

An indicating circuit for a switching power supply is provided. An LED and a resistor are connected in series, and then are connected in parallel with a capacitor, and the parallel-connected circuit and a diode are connected in series in the same direction, and then are connected in parallel with an inductor to form the indicating circuit. The cathode of the (Continued)

indicating circuit is a terminal 1, and the anode of the indicating circuit is a terminal 2. A charging loop between a rectifying bridge and an electrolytic capacitor for filtering in a fly-back switching power supply is broken to insert the indicating circuit; when the electrolytic capacitor for filtering is normal, an excitation current of a main power stage basically does not appear in the inductor, and the LED does not emit light; when the ESR of the electrolytic capacitor rises greatly, the excitation current of the main power stage appears in the inductor; furthermore, when a switching transistor in the switching power supply is switched off, the excitation current flowing through the inductor may not be changed abruptly, and is freewheeled by the diode; after being filtered by the capacitor, the excitation current drives the LED to emit light; the LED may be a light emitter of a photocoupler to notify a user that: the ESR of the filter capacitor has risen and the switching power supply has a risk of failure, thereby avoiding aggravation of loss; and the indicating circuit has the characteristics of low cost and easiness in implementation.

5 Claims, 12 Drawing Sheets

(51) Int. Cl.
| | |
|---|---|
| *G01R 31/00* | (2006.01) |
| *G05F 1/565* | (2006.01) |
| *H01H 9/16* | (2006.01) |
| *G01R 31/40* | (2020.01) |
| *G01R 19/165* | (2006.01) |

(52) U.S. Cl.
CPC ....... *H05B 45/37* (2020.01); *G01R 19/16533* (2013.01); *G01R 31/40* (2013.01)

(56) References Cited

U.S. PATENT DOCUMENTS

| | | | | |
|---|---|---|---|---|
| 5,003,578 | A | * 3/1991 | Lin | ............... G06F 1/3209 |
| | | | | 379/102.04 |
| 2001/0011413 | A1* | 8/2001 | Yamaguchi | ........... H01F 41/074 |
| | | | | 29/600 |
| 2001/0046136 | A1* | 11/2001 | Weber | ............... B60Q 1/2665 |
| | | | | 362/494 |
| 2009/0284993 | A1* | 11/2009 | Zheng | ............... H02M 3/3385 |
| | | | | 363/21.08 |
| 2012/0236614 | A1* | 9/2012 | Kamata | ............... H02M 1/32 |
| | | | | 363/131 |

FOREIGN PATENT DOCUMENTS

| | | | |
|---|---|---|---|
| CN | 102594175 | | 6/2014 |
| CN | 105491728 | | 4/2016 |
| CN | 105527524 | | 4/2016 |
| CN | 105577003 | | 5/2016 |
| JP | 2000032747 A | * | 1/2000 |
| JP | 2010093887 A | * | 4/2010 |

OTHER PUBLICATIONS

Harada et al., Use of ESR for Deterioration Diagnosis of Electrolytic Capacitor, IEEE Transactions on Power Electronics, vol. 8, No. 4, Oct. 1993 (Year: 1993).*

Malagoni et al., An Online and Noninvasive Technique for the Condition Monitoring of Capacitors in Boost Converters, IEEE Transactions on Instrumentation and Measurement, vol. 59, No. 8, Aug. 2010 (Year: 2010).*

"International Search Report (Form PCT/ISA/210)", dated Nov. 30, 2016, with English translation thereof, pp. 1-4.

* cited by examiner

INDICATING CIRCUIT FOR SWITCHING POWER SUPPLY AND USE METHOD THEREOF

CROSS-REFERENCE TO RELATED APPLICATION

This application is a 371 application of the international PCT application serial no. PCT/CN2016/096354, filed on Aug. 23, 2016, which claims the priority benefit of China application no. 201610040378.3, filed on Jan. 21, 2016. The entirety of each of the abovementioned patent applications is hereby incorporated by reference herein and made a part of this specification.

BACKGROUND

Technical Field

The present application relates to an indicating circuit and a use method thereof, and more particularly relates to an indicating circuit for an electrolytic capacitor in a switching power supply as it approaches the end of lifetime and a use method of the indicating circuit.

Description of Related Art

At the present, switching power supplies are widely applied. Under condition where input power should be less than 75 W and no requirements are made to Power Factors (PF), fly-back switching power supplies have the advantages having simple circuit topology and wide input voltage range. The fly-back switching power supplies are widely applied because of having a small number of elements and have relatively high circuit reliability. These switching power supplies are also called fly-back switching power supplies and fly-back power supplies in the literature, and are called fly-back converters in Japan and Taiwan. Common topology is as shown in FIG. 1, which is from page 60 of *Topology and Design of Power Converter of Switching Power Supply* ISBN978-7-5083-9015-4 written by Dr. Zhang Xingzhu. The switching power supply consists of a rectifying bridge 101, a filter circuit 200 and a basic fly-back topology unit circuit 300 which is known as a main power stage for short. In a practical circuit, protective circuits such as a voltage dependent resistor, an NTC (Negative Temperature Coefficient) thermistor and an EMI (Electromagnetic Interference) protective circuit are also additionally arranged in front of the rectifying bridge, so as to ensure that the electromagnetic compatibility of the fly-back power supply meets a use requirement.

The filter circuit 200 generally consists of an electrolytic capacitor CL and the like. With the popularization of intelligent systems in the industrial field, low-power fly-back power supplies are applied into all fields, but their disadvantages are also exposed accordingly. Because the electrolytic capacitor CL is used, its characteristics limit the use of the fly-back power supply as shown in FIG. 1. The low and high-temperature service lives of the electrolytic capacitor have always been an industrial problem. It is well known that the capacitor CL is generally an electrolytic capacitor having the withstand voltage of 400 V, but an electrolytic capacitor having the withstand voltage higher than 250 V usually only works at a temperature down to −25 DEG C. That is to say, under an environment with a temperature of −40 DEG C., such as three provinces in the northeast of China, Xinjiang, and countries and districts at high latitudes, the use of the low-power fly-back power supply becomes difficult. Of course, a CBB thin film capacitor may be used for realizing filtering, but it is extremely large in volume and extremely high in cost.

With extremely high capacitance per unit volume, the electrolytic capacitor is still a low-cost solution for a switching power supply having a fly-back power supply, particularly in the field of inputting of alternating current at the present, and is mostly applied to various power supplies, For example, switching power supplies are used in various smart phone chargers, notebook computer adapters, power supplies of various color TVs, power supplies of desk computers, standby power supplies of air conditioners and the like, and therefore, the electrolytic capacitor is also used.

When the electrolytic capacitor is used as an input rectifying and filter capacitor in the fly-back switching power supply, ripple current of the electrolytic capacitor is low-frequency pulsating direct current during charging, or high-frequency ripple current during discharging. The high-frequency ripple current is from the excitation current of the main power stage.

When a switching power supply is designed, the problem on the service life of the electrolytic capacitor CL often exists, and this service life is generally determined by factors such as withstand voltage, ESR (Equivalent Series Resistance), ripple current and a loss angle (tg δ). Particularly the maximum ripple current, also called maximum allowable ripple current, namely rated ripple current (IRAC), is defined as: an effective value of the maximum bearable alternating current ripple current of a capacitor under a highest working temperature condition. Furthermore, a sine wave absolute value at a standard frequency (generally 100 to 120 Hz) is an assigned ripple current.

In actual use, many fly-back power supplies do not achieve the rated service lifetime, and it is mainly because their electrolytic capacitors for filtering fail in advance. On many occasions having relatively high requirements, a redundant design is adopted, namely two switching power supplies are used as mutual spares. If one switching power supply is broken, normal function is maintained, but the cost is relatively high, and one still cannot know when the other switching power supply would fail.

Even in other applications, for example, in a high-power switching power supply having a PFC function, the voltage is firstly increased to 380 V by means of a BOOST circuit to charge the electrolytic capacitor, thus obtaining relatively smooth direct current, and then the direct current is supplied to a double-transistor forward or LLC converter, but the failure of the electrolytic capacitor still may not be known in advance.

On a common non-redundant design occasion, the failure of the switching power supply may link to other failures, so that the loss would be increased. Statistically, 97 percent or above of the failure of the switching power supply is first caused by the first failure of the electrolytic capacitor for filtering.

The existing switching power supply using the electrolytic capacitor cannot effectively forecast the failure of the electrolytic capacitor.

SUMMARY OF THE INVENTION

In view of this, the present application provides an indicating circuit and a use method thereof. The indicating circuit provides an indication before an electrolytic capacitor for filtering in a switching power supply fails, so that the electrolytic capacitor for filtering of the switching power supply may be replaced before the switching power supply fails, to enable the system to work normally.

A solution I of the indicating circuit provided by the present application includes a first terminal, a second terminal, a first inductor and a first light emitting diode. The first light emitting diode is connected in parallel with the first inductor; a connection point of the cathode of the first light emitting diode and the first inductor forms the first terminal; and a connection point of the anode of the first light emitting diode and the first inductor forms the second terminal.

Preferably, a solution II of the indicating circuit provided by the present application further includes a first diode. A connection relation is as follows: the first diode is connected in series with the first light emitting diode in the same direction to form a first network; the first network is connected in parallel with the first inductor; a connection point of the cathode of the first network and the first inductor forms the first terminal; and a connection point of the anode of the first network and the first inductor forms the second terminal.

Preferably, a solution III of the indicating circuit provided by the present application further includes a first resistor. A connection relation is as follows: the first diode, the first light emitting diode and the first resistor are connected in series in the same direction to than a second network; the second network is connected in parallel with the first inductor; a connection point of the cathode of the second network and the first inductor forms the first terminal; and a connection point of the anode of the second network and the first inductor forms the second terminal.

Preferably, a solution IV of the indicating circuit provided by the present application further includes a first capacitor. A connection relation is as follows: the first light emitting diode and the first resistor are connected in series, and then are connected in parallel with the first capacitor to form a third network which is then connected in series with the first diode in the same direction to form a fourth network; the fourth network is connected in parallel with the first inductor; a connection point of the cathode of the fourth network and the first inductor forms the first terminal; and a connection point of the anode of the fourth network and the first inductor forms the second terminal.

In the above-mentioned technical solutions, an indicating lamp, namely the first light emitting diode, is not isolated from a charging loop. The present application further provides a solution V of the indicating circuit, realizing an isolation function. The solution V of the indicating circuit includes a first terminal, a second terminal, a first transformer and a first light emitting diode. The first transformer at least includes a primary winding and a secondary winding; the first light emitting diode is connected in parallel with the secondary winding of the first transformer, and the terminal, which is connected with the cathode of the first light emitting diode, of the secondary winding is used as a dotted terminal; the corresponding dotted terminal of the primary winding is used as the first terminal; and the other terminal of the primary winding is used as the second terminal.

Preferably, a solution VI of the indicating circuit provided by the present application further includes a first diode. A connection relation is as follows: the first diode is connected in series with the first light emitting diode in the same direction to form a first network; the first network is connected in parallel with the secondary winding of the first transformer, and the terminal, which is connected with the cathode, of the secondary winding is used as a dotted terminal; the corresponding dotted terminal of the primary winding is used as the first terminal; and the other terminal of the primary winding is used as the second terminal.

Preferably, a solution VII of the indicating circuit provided by the present application further includes a first resistor. A connection relation is as follows: the first diode, the first light emitting diode and the first resistor are connected in series in the same direction to form a second network; the second network is connected in parallel with the secondary winding of the first transformer, and the terminal, which is connected with the cathode of the second network, of the secondary winding is used as a dotted terminal; the corresponding dotted terminal of the primary winding is used as the first terminal; and the other terminal of the primary winding is used as the second terminal.

Preferably, a solution VIII of the indicating circuit provided by the present application further includes a first capacitor. A connection relation is as follows:

the first light emitting diode and the first resistor are connected in series, and then are connected in parallel with the first capacitor to form a third network which is then connected in series with the first diode in the same direction to form a fourth network; the fourth network is connected in parallel with the secondary winding of the first transformer, and the terminal, which is connected with the cathode of the fourth network, of the secondary winding is used as a dotted terminal; the corresponding dotted terminal of the primary winding is used as the first terminal; and the other terminal of the primary winding is used as the second terminal.

Preferably, the above-mentioned solutions I, II, III and IV are characterized in that the first inductor is a section of lead wire on a circuit board.

Preferably, the above-mentioned solutions V, VI, VII and VIII are characterized in that the primary winding of the first transformer is a section of lead wire on a circuit board.

Preferably, the above-mentioned solutions I, II, III, IV, V, VI, VII and VIII are characterized in that the first light emitting diode is a light emitter in a photocoupler, namely a light emitting diode in the photocoupler.

Preferably, according to all the above-mentioned solutions, the indicating circuit further includes a second resistor which is connected in parallel to two ends of the first light emitting diode.

The present application further provides a use method applying the above-mentioned solutions I, II, III, IV, V, VI, VII and VIII and preferred solutions. The use method includes the steps of: breaking a charging loop between a rectifying bridge and an electrolytic capacitor for filtering in a fly-back power supply, and inserting the indicating circuit and ensure that low-frequency pulsating direct current for charging flows into the indicating circuit from the first terminal and flows out of the indicating circuit from the second terminal, and also ensure that an excitation current of a main power stage of the fly-back power supply does not directly pass through the indicating circuit.

The working principle will be described in detail in combination with embodiments.

The present application has the beneficial effects as follows:

the cost is extremely low, and the insertion loss is low, which nearly has no influence on the efficiency of the original switching power supply. The indicating circuit is simple in wiring, small size and convenient to use. Moreover, compared with the prior art, the indicating circuit also has the advantages that: before the electrolytic capacitor fails, the light emitting diode of the indicating lamp emits light or current flows through the light emitting diode in the photocoupler, and the photocoupler outputs an isolation signal to notify a user or a circuit.

BRIEF DESCRIPTION OF THE DRAWINGS

FIG. 2-1 is a schematic diagram of a first embodiment corresponding to the solution I of the present application;

FIG. 2-2 is a schematic diagram of a second embodiment corresponding to the solution II of the present application;

FIG. 2-3 is a schematic diagram of another implementation method of the second embodiment corresponding to the solution II of the present application;

FIG. 2-4 is a schematic diagram of a third embodiment corresponding to the solution III of the present application;

FIG. 2-5 is a schematic diagram of a fourth embodiment corresponding to the solution IV of the present application;

FIG. 2-6 is a schematic diagram of another implementation method of the fourth embodiment corresponding to the solution IV of the present application;

FIG. 3-1 is a schematic diagram of a fifth embodiment corresponding to the solution V of the present application;

FIG. 3-2 is a schematic diagram of a sixth embodiment corresponding to the solution VI of the present application;

FIG. 3-3 is a schematic diagram of another implementation method of the sixth embodiment corresponding to the solution VI of the present application;

FIG. 3-4 is a schematic diagram of a seventh embodiment corresponding to the solution VII of the present application;

FIG. 3-5 is a schematic diagram of an eighth embodiment corresponding to the solution VIII of the present application;

FIG. 3-6 is a schematic diagram of another implementation method of the eighth embodiment corresponding to the solution VIII of the present application;

FIG. 4 is a schematic diagram of application of the first embodiment to a 25 W fly-back power supply;

FIG. 5 is a schematic diagram of a path of charging current generated by a rectifying bridge to an electrolytic capacitor in a fly-back power supply;

FIG. 6 is a sequence chart of driving voltage and excitation current of a switching transistor in a main power stage of a fly-back power supply;

DETAILED DESCRIPTION OF THE EMBODIMENTS

First Embodiment

Figure 1:
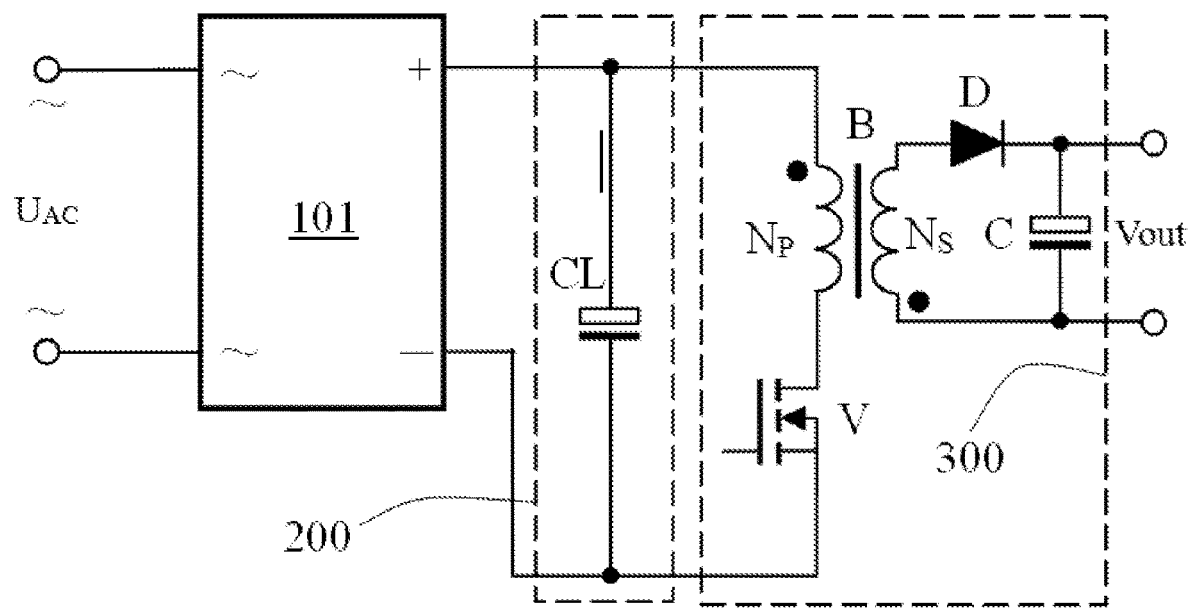
FIG. 1 is a common topology of a fly-back switching power supply in an existing document.
Figures 1, 2:
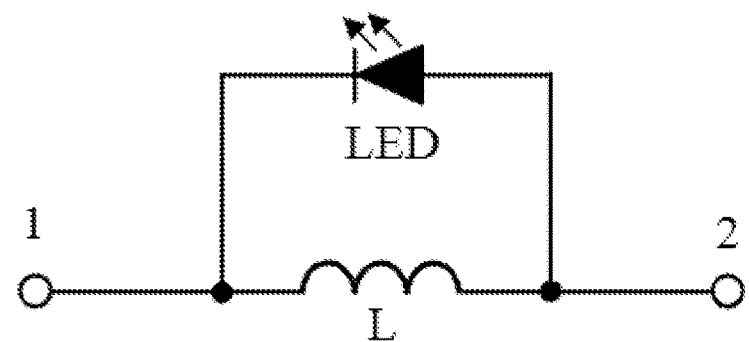
Figure 2:
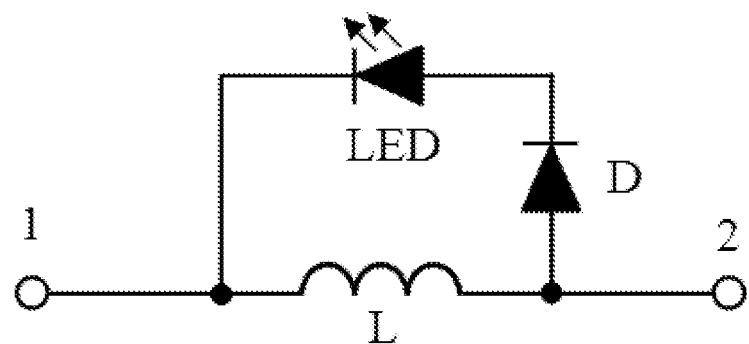

With reference to FIG. 2-1, a corresponding solution I includes a first terminal 1, a second terminal 2, a first inductor L and a first light emitting diode LED. The first light emitting diode LED is connected in parallel with the first inductor L; a connection point of the cathode of the first light emitting diode LED and the inductor L forms the first terminal 1; and a connection point of the anode of the first light emitting diode LED and the inductor L forms the second terminal 2.

The light emitting diode LED uses a Φ3 mm high brightness red light emitting diode. For convenience, the light emitting diode is LED for short, with model number 3AR2UD. The inductor adopts a 4.7 uH I-shaped inductor. A use method of the solution I includes: breaking a charging loop between a rectifying bridge and an electrolytic capacitor for filtering in a 25 W fly-back power supply, and inserting the first embodiment of the indicating circuit, ensuring that low-frequency pulsating direct current for charging flows into the indicating circuit from the first terminal 1 and flows out of the indicating circuit from the second terminal 2, and also ensuring that an excitation current of a main power stage of the fly-back power supply does not directly pass through the indicating circuit.

The electrolytic capacitor for filtering of the 25 W fly-back power supply is at 47 uF/400 V, which is a domestically produced high-quality capacitor. The rectifying bridge consists of four diodes 1N4007, with the working frequency of 65 KHz. Under an input of 220 VAC, the full-load maximum duty ratio is 0.24.

After the first embodiment is welded into the fly-back power supply, indexes of all aspects are all the same as those in the prior art according to actual measurement. Particularly, the conversion efficiency has no visible reduction, and the LED does not emit light.

To verify that the present application can work, the inventor adopts a method which is first put forward to test the first embodiment:

due to difficulty in finding a failed electrolytic capacitor, an adjustable resistor is connected in series into the electrolytic capacitor for filtering to simulate an electrolytic capacitor with lowered performance. The resistance value of the adjustable resistor may be adjusted within a range of 0 to 39Ω here. When the resistance value of the adjustable resistor is adjusted to 5Ω, the ESR of the electrolytic capacitor at 47 uF/400 V has risen to 5.5Ω from the qualified 0.5Ω equivalently, and the electrolytic capacitor is on the edge of failure.

At this time, the LED in FIG. 2-1 emits light, and an average value of the working current is 0.9 mA according to actual measurement. The indicating sensitivity is initially adjusted by selecting inductors L having different inductances. Low inductance of the inductor L leads to low sensitivity, and the high inductance of the inductor L leads to high the sensitivity. During light emitting of the LED, there is a forward voltage drop of 1.6 to 2.2 V, so that the sensitivity may be completely adjusted by connecting a resistor to the two ends of the LED in parallel. In this embodiment, if the resistor of 1.6 K is adopted, voltage generated by current of 1 mA or below at two ends of the parallel-connected resistor is 1.6 V or below, and at this time, the LED does not emit light.

Remarks: the conducting voltage drop of a white-light LED is about 3.0 V, and a red one and a green one will have different voltage drops. The conducting voltage drop of the light emitter inside the photocoupler is about 1.1 V.

Therefore, after the performance of the electrolytic capacitor is reduced, the LED may emit light, indicating that the current of the LED flows from the anode of the LED to the cathode, namely in FIG. 2-1, there is one current flowing from the terminal 2 to the terminal 1 through the LED.

Remarks: before this application, persons skilled in the art think that the electrolytic capacitor still has a filter function when its ESR rises to the failure edge, so that it is impossible to generate current in such a flowing direction. However, these persons have ignored a very subtle factor that the freewheeling current in the inductor L may generate a voltage drop on the ESR at the moment that a main power switching transistor in the main power stage is changed from a conducting state into a switched off state. The inventor makes use of this voltage drop to drive the LED to be an indicating lamp. However, before the present application, the persons skilled in the art must adopt a complicated online detection circuit in order to achieve the objective of the present application, and it is inevitable that introducing that technical solution into the switching power supply will lead to reduction of the efficiency, and increase the size and cost of a product.

Figures 2, 3:
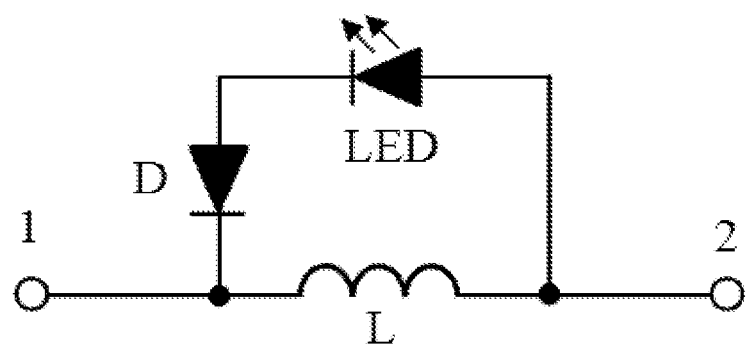
Figures 2, 3, 4:
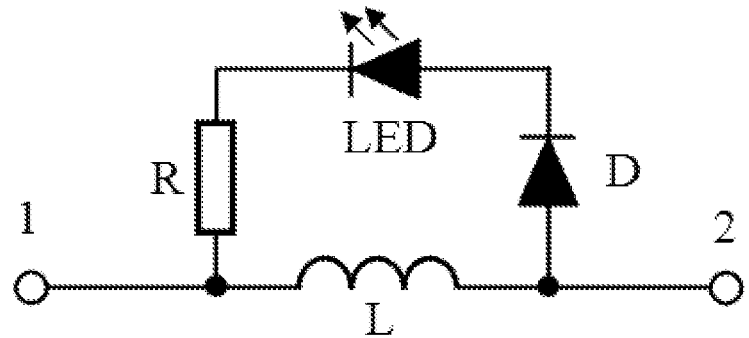

The working principle firstly put forward by the inventor of the application will be described below to describe where this current is from:

With reference to FIG. 4, it is a schematic diagram of application of the first embodiment to the 25 W fly-back power supply according to the method in the technical solution of the present application, wherein CL is the electrolytic capacitor for filtering.

If the electrolytic capacitor CL is normal, two of the four diodes in the rectifying bridge 101 are conducted at the same time only when input alternating current is close to a peak value, so as to supplement electric energy to the electrolytic capacitor CL. This rectifying mode is described in the background art of the patent No. CN102594175 B, and is particularly described in detail in paragraph 0010.

Figures 2, 3, 4, 5:
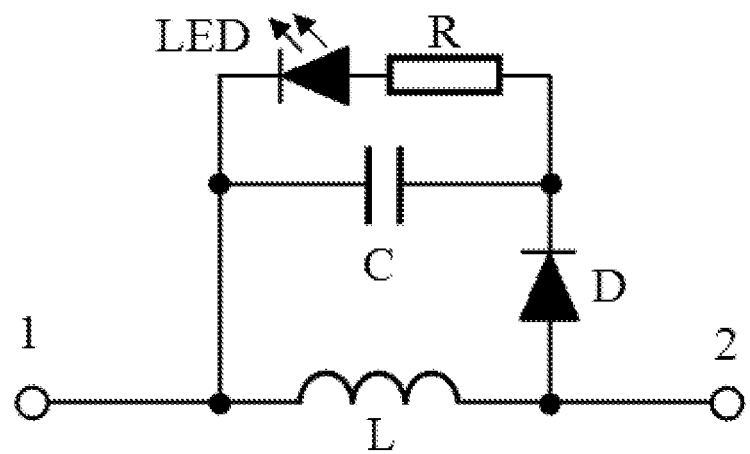

A path of charging current generated by the rectifying bridge 101 is as shown in FIG. 5: flowing from one end of the alternating current input end, passing through one end of the rectifying bridge 101 to the output+ of the rectifying bridge 101 to the first terminal of the indicating circuit, flowing out from the second terminal of the indicating circuit to the anode of the electrolytic capacitor CL for filtering, the flowing out from the cathode of the electrolytic capacitor CL to the output− of the rectifying bridge 101, and flowing out from the other terminal of the rectifying bridge 101 to the other end of the alternating current input end.

In this process, the frequency of the charging current is 100 or 120 Hz, which is twice the mains supply; and the inductor L is 4.7 uH, with the inductive impedance of $2\pi fL$, which is only 3.5 mΩ. The LED is in reversal of biasing, and does not emit light.

Figures 2, 3, 4, 5, 6:
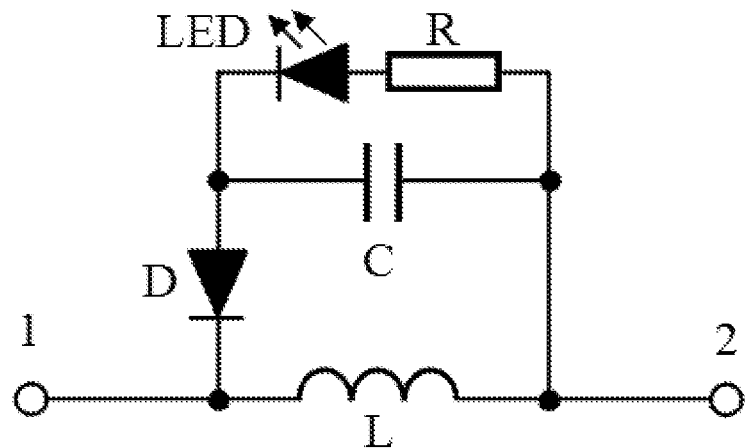
Figures 1, 3:
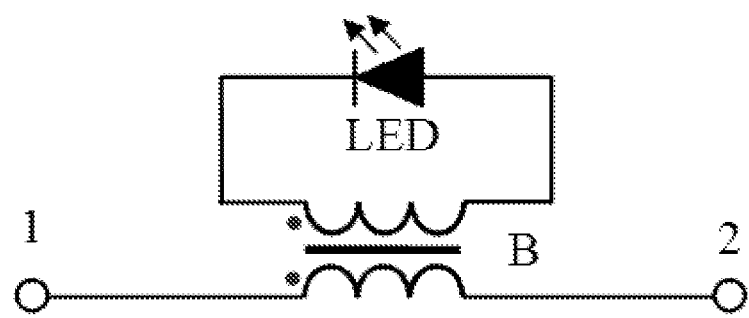
Figures 2, 3:
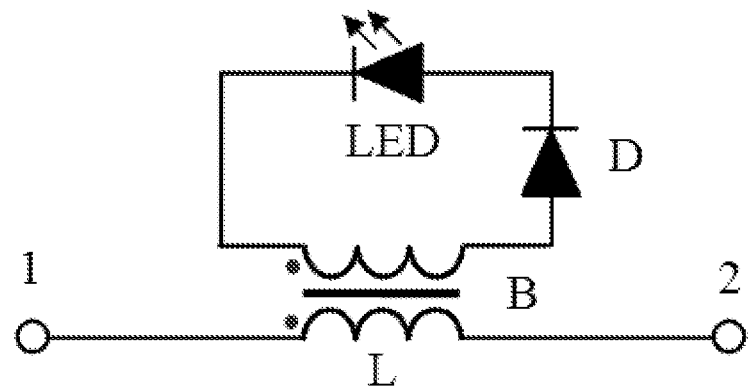
Figure 3:
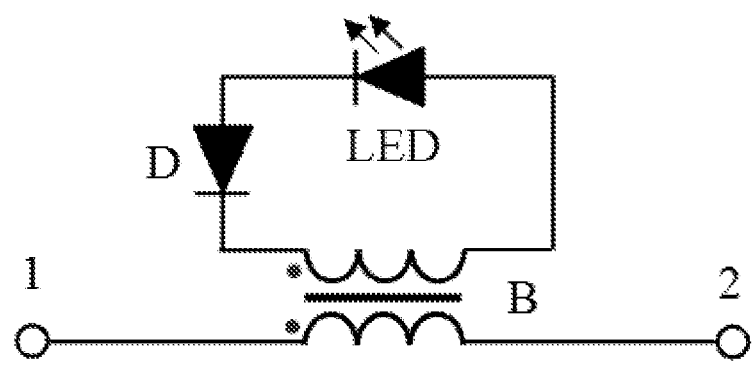
Figures 3, 4:
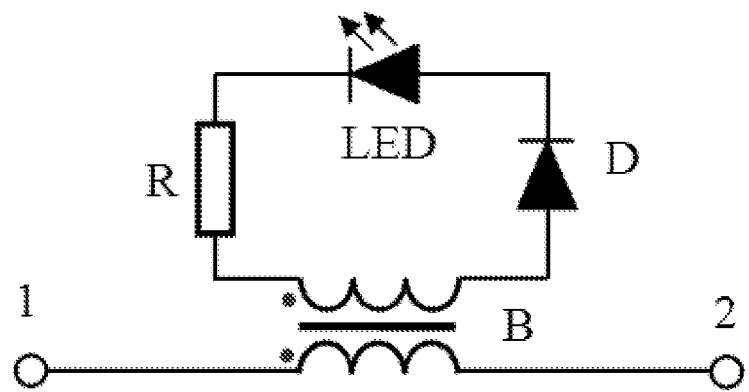
Figures 3, 4, 5:
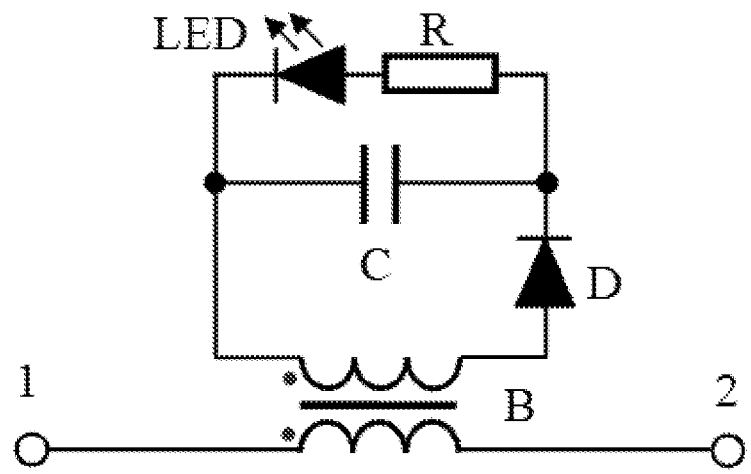
Figures 3, 4, 5, 6:
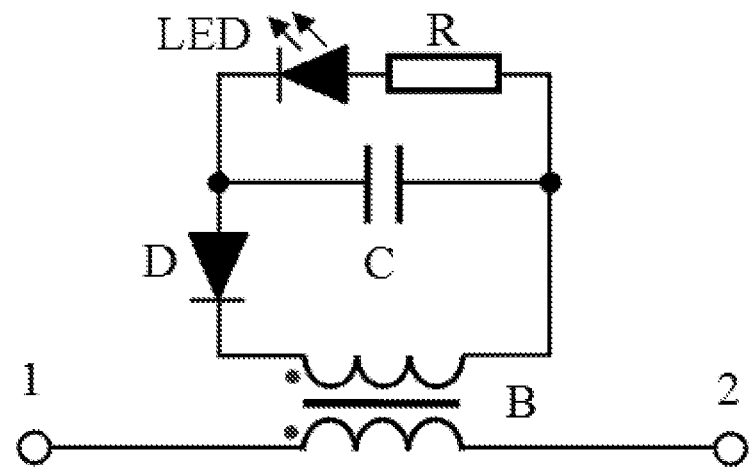
Figure 4:
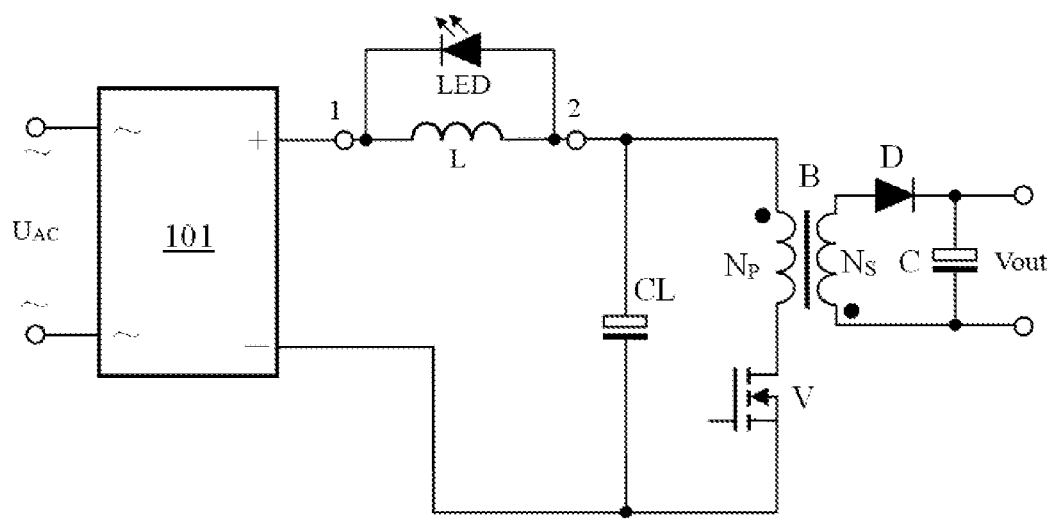
Figure 5:
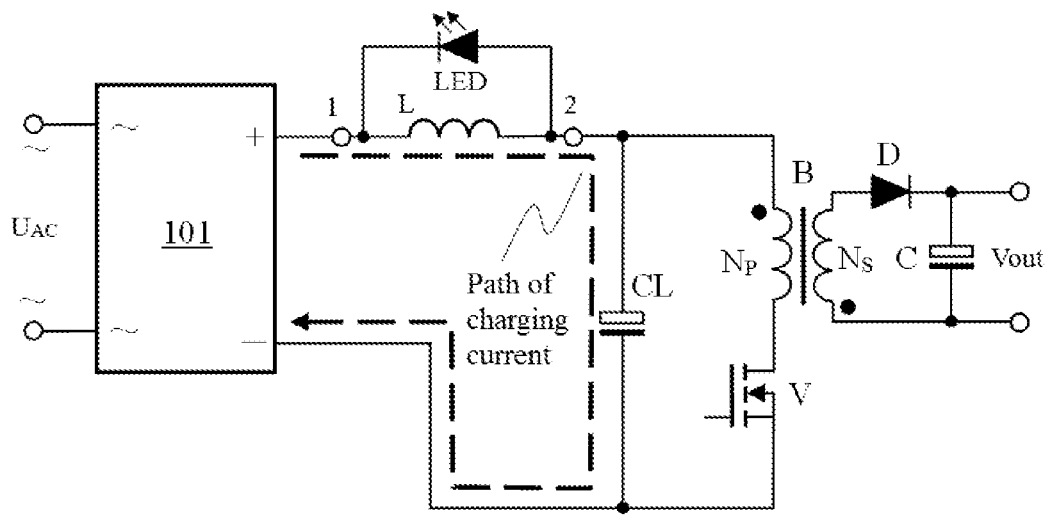
Figure 6:
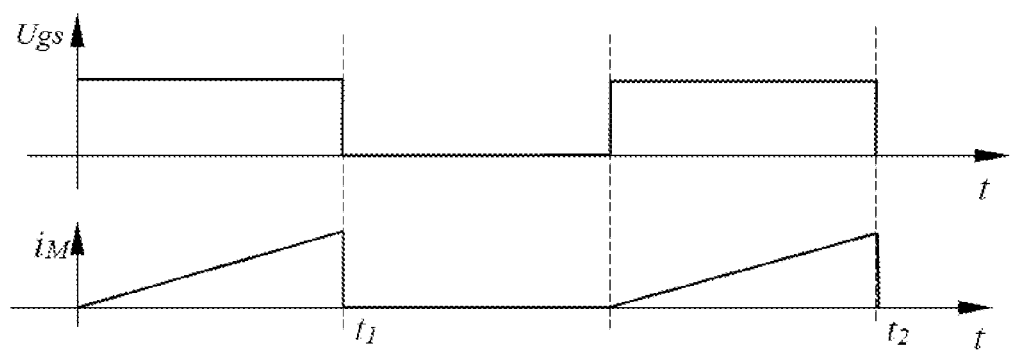
Figure 7:
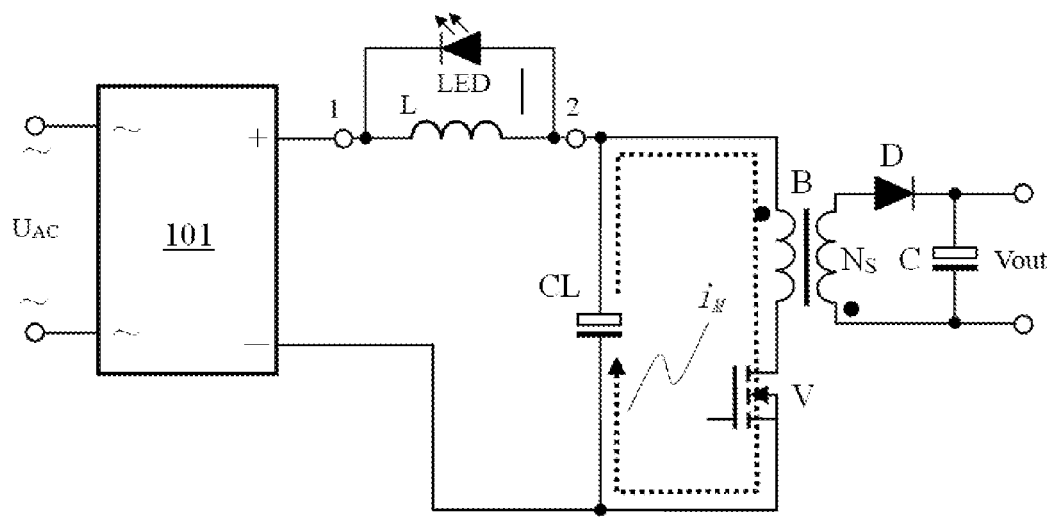
FIG. 7 is a schematic diagram of a path of excitation current $i_M$ when a rectifying bridge is not conducted.

When the electrolytic capacitor CL is normal, such as the above-mentioned electrolytic capacitor at 47 uF/400 V, its ESR (Equivalent Series Resistance) under 65 KHz is 0.5Ω, namely when a switching transistor V works normally, the excitation current $i_M$ of the main power stage is as shown in FIG. 6, wherein Ugs is a driving voltage of the gate electrode and the source electrode of the switching transistor V. The path of the excitation current $i_M$ is as shown in FIG. 7.

When the rectifying bridge 101 is not conducted, the discharging current of the electrolytic capacitor CL to the main power stage is completely equal to the excitation current $i_M$ of the main power stage.

When the rectifying bridge 101 is conducted, the capacitive impedance of the electrolytic capacitor CL under 65 KHz is $1/(2\pi fC)$, which is calculated as 52 mΩ and is much less than the ESR. Under 65 KHz, the ESR plays a leading role, and the inductive impedance of the inductor L is 1.9Ω.

When the input alternating current is close to the peak value, two diodes in the rectifying bridge 101 are conducted, and are connected in series in their dynamic internal resistance which is about 1.1Ω. According to the hot internal resistance of an NTC (negative temperature coefficient thermistor) in an alternating current input loop in the fly-back power supply, the hot internal resistance of the NTC in this embodiment is about 1.8Ω, and the internal resistance of alternating current is generally 1Ω, so that for the high-frequency discharging current at 65 KHz, the total impedance $R_{ALL}$ seen from the inductor L is about 1.9+1.1+1.8+1=5.8Ω, but the actual total impedance is higher because this is just an estimation. It is very complicated to calculate the compound impedance. Particularly, the waveform as shown in FIG. 6 is not a sine wave, but its fundamental wave is the sine wave and its harmonic frequency is even higher than 65 KHz. Therefore, the above is only an estimation.

Figure 8:
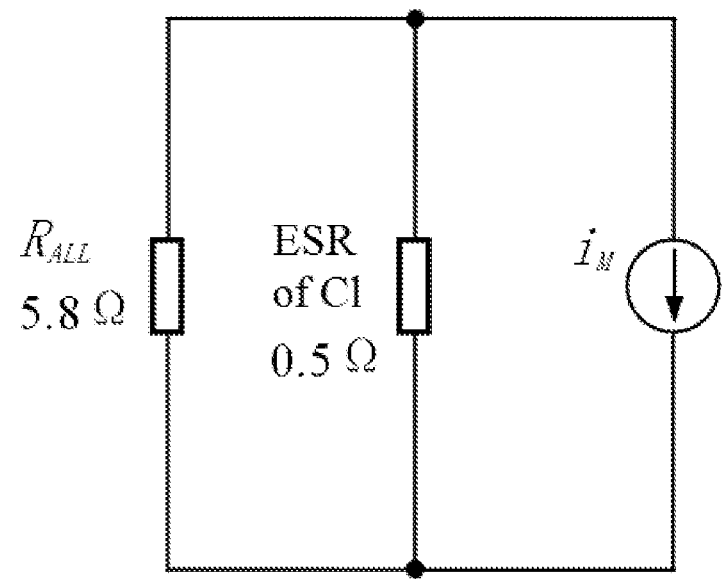
FIG. 8 is an equivalent circuit diagram related to the excitation current of the main power stage when a diode in the rectifying bridge is conducted.

An equivalent circuit is as shown in FIG. 8. When the rectifying bridge 101 is conducted, namely when the input alternating current is close to the peak value, and the two diodes in the rectifying bridge 101 are conducted, the excitation current $i_M$ of the main power stage is supplied from two places, one being discharging current $i_{CL}$ of the electrolytic capacitor CL to the main power stage and the other one being alternating current supplied by the inductor L and recorded as $i_R$. It can be calculated according to FIG. 8 that $i_{CL}=11.6\ i_R$, and $12.6\ i_R=i_M$, namely $i_R=0.08\ i_M$.

The working frequency of the 25 W fly-back power supply is 65 KHz. Under an input of 220 VAC, the full load maximum duty ratio is 0.24. If the average value of the excitation current $i_M$ of the main power stage is about 408 mA during conducting of the switching transistor V, and the peak value is about 816 mA, the inductor L also has an excitation current during conducting of the rectifying bridge 101, and the peak value of this excitation current is 0.08× 816=65.3 mA, and appears at $t_1$ or $t_2$ in FIG. 6, namely the time before the moment that the switching transistor V is changed from the conducting state into the switched off state. As the current in the inductor may not be changed abruptly, the current of 65.3 mA in the inductor L would continuously flow forwards. If the ESR of the electrolytic capacitor CL is zero in an ideal case, the electrolytic capacitor CL may absorb this current. As the electrolytic capacitor absorbs the current, its end voltage would rise, and the varying voltage may be calculated by a formula:

energy storage formulas of an inductor and a capacitor. Furthermore, the current may be completely transferred from the inductor to the capacitor, so that it can be seen that:

$$0.5LI^2=0.5CV^2$$

$$0.5Li_R^2=0.5C(V_1^2-V_2^2),$$

a calculation result is that: the end voltage approximately rises 0.71 uV. It can be understood that the voltage of the second terminal 2 is 0.71 uV higher than that of the first terminal 1. At this time, the ESR of the electrolytic capacitor CL plays a leading role for this current, namely a voltage drop generated by the current of 65.3 mA on the ESR is $U$=IR=65.3 mA×0.5Ω=0.0326 V.

It can be understood that the voltage of the second terminal 2 is 0.0326 V higher than that of the first terminal 1, which is determined by the external freewheeling characteristic of the inductor. This voltage is not high enough to cause forward conduction of the light emitting diode LED, so that the LED still does not emit light.

It can be seen from FIG. 5, FIG. 6 and FIG. 7 that if a circuit board is designed correctly, only a very small part of the discharging current of the electrolytic capacitor CL to the main power stage flows through the inductor L. During analysis of the working principle, the working principle is similar to that of an existing textbook. In such case, it can be understood that the discharging current of the electrolytic capacitor CL to the main power stage does not flow through the inductor L, thereby facilitating the understanding of the working principle.

Figure 9:
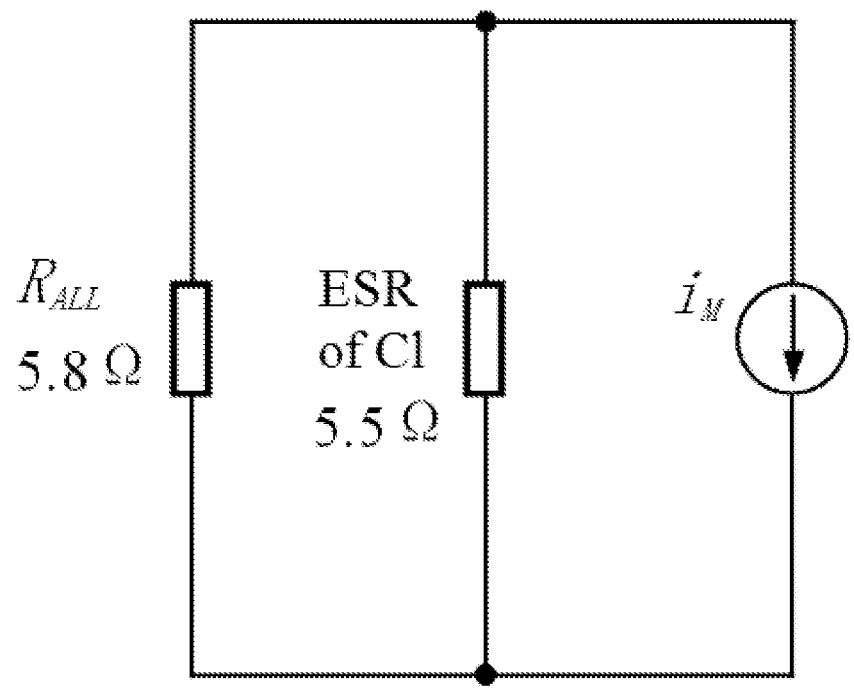
FIG. 9 is an equivalent circuit diagram related to the excitation current of the main power stage when the diode in the rectifying bridge is conducted after the ESR (Equivalent Series Resistance) of the electrolytic capacitor is increased.

When the ESR of the electrolytic capacitor CL has risen to 5.5Ω from the qualified 0.5Ω, namely the electrolytic capacitor CL is on the edge of failure, and its equivalent circuit is as shown in FIG. 9. When the rectifying bridge 101 is conducted, namely when the input alternating current is close to the peak value, the two diodes in the rectifying bridge 101 are conducted, and at this time, the excitation current $i_M$ of the main power stage is supplied from two places, one being discharging current $i_{CL}$ of the electrolytic capacitor CL to the main power stage and the other one being alternating current supplied by the inductor L and recorded as $i_R$. It can be calculated according to FIG. 9 that $i_{CL}$=1.054 $i_R$, and $i_R$=0.486 $i_M$.

Under the same condition, when rectifying bridge 101 is conducted, the inductor L also has an excitation current, the peak value of which is 0.486×816=397 mA and appears at $t_1$ or $t_2$ in FIG. 6, namely before the moment that the switching transistor V is changed from the conducting state into the switched off state. As the current in the inductor may not be changed abruptly, the current of 397 mA in the inductor L would continuously flow forwards. If the ESR of the electrolytic capacitor CL has risen to 5.5Ω, a voltage drop generated on the ESR by the current of 397 mA is $U$=IR=397 mA×5.5Ω=2.18 V.

Figure 10:
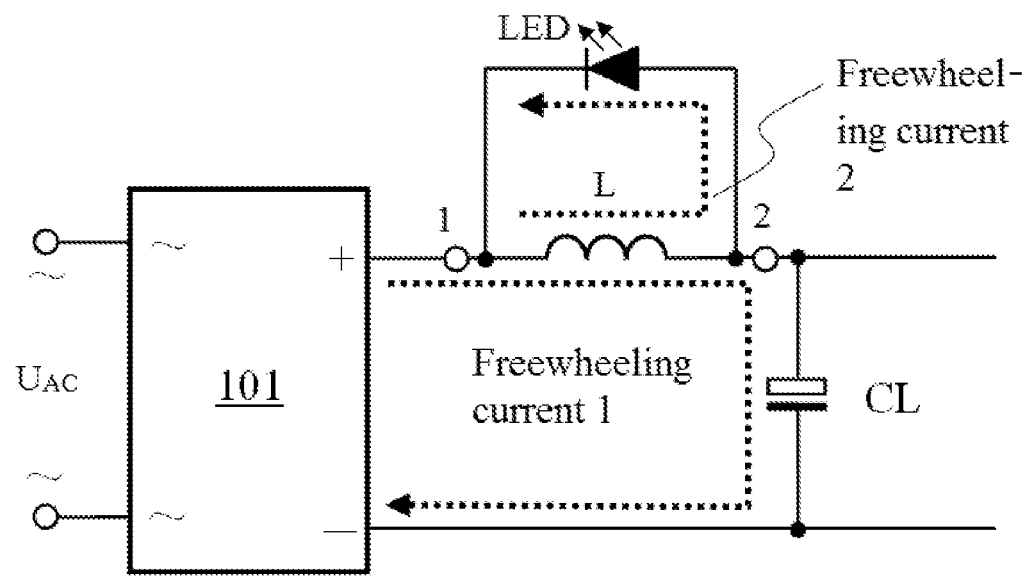
FIG. 10 is a schematic diagram of a path of freewheeling current of an inductor L to the outside at the moment that a switching transistor V is switched off after the ESR of the electrolytic capacitor is increased.

It can be understood that the voltage of the second terminal 2 is 2.18 V higher than that of the first terminal 1, which is determined by the external freewheeling characteristic of the inductor. This voltage is high enough to cause forward conduction of the light emitting diode LED, so that the LED emits light. As shown in FIG. 10, one part of the freewheeling current of the inductor L flows through the LED, as shown in a freewheeling current 2 in the figure, and the other part of the freewheeling current still charges the electrolytic capacitor CL, as shown in a freewheeling current 1 in the figure.

The working principle of the present application is not complicated. If someone reads the above-mentioned analysis of the working principle carefully, it is easy to understand that the current flowing through the inductor may not be changed abruptly, so that when the ESR of the electrolytic capacitor rises, the excitation current obtained in the inductor L is multiplied, from 65.3 mA to 397 mA in the above example, which is six times the original current; at this time, the varying voltage generated on the ESR by the excitation current in the inductor L is higher than a forward light emitting voltage of the LED, so that the freewheeling current 2 is generated to drive the LED to emit light to notify a user that: the ESR of the electrolytic capacitor CL has risen to a concerning point, and the user can decide the next measure.

As the rectifying bridge is conducted by a little of time within the alternating current half cycle of 10 mS, for example, by 0.93 mS in this embodiment, the average value of the current flowing through the LED is 0.9 mA according to actual measurement, and the LED with high brightness is still striking.

At this time, the electrolytic capacitor may still work, but the excitation current of the main power stage generates relatively high heat on the ESR, which is 0.22 W in this embodiment. The electrolytic capacitor is in accelerated aging under the high heat, so that in general cases, the ESR rises quickly within dozens of hours to hundreds of hours, thereby resulting in higher heat till the electrolytic capacitor fails and loses its capacitance, which may cause a series of failures such as bombing out of the switching transistor.

Therefore, the first embodiment may achieve the invention objective.

With reference to FIG. 4, at the electrification moment of the switching power supply, it is most possible that the alternating current is in a high-voltage state instead of a zero volt state. As the end voltage of the electrolytic capacitor CL is zero, and may not be changed abruptly, the current in the inductor L is zero, and may not be changed abruptly. At the electrification moment, after passing through the rectifying bridge, most of instantaneous alternating current may be applied to two ends of the LED to reversely break down the LED. The withstand voltage nominal value of the LED is generally only about 5 to 10 V, and is about 35 V according to actual measurement, and a few of manufacturers can make the value at about 170 V, but the LED still may not bear the peak value of the alternating current. Therefore, a second embodiment is to solve this problem.

Second Embodiment

With reference to FIG. 2-2, on the basis of the first embodiment, the corresponding solution II further includes a first diode D. A connection relation is as follows: the first diode D is connected in series with the first light emitting diode LED in the same direction to form a first network; the first network is connected in parallel with the first inductor L; a connection point of the cathode of the first network and the inductor forms the first terminal 1; and a connection point of the first network and the inductor L forms the second terminal 2.

Explanations will be made below to nouns appearing in the application or related nouns:

a two-terminal network is as follows: which is a circuit structure formed by interconnecting one or two or more elements and has two terminals.

The anode and the cathode of the two-terminal network are as follows: for the two-terminal network having unidirectional conductivity, when the voltage of the anode is higher than that of the cathode, current may be generated; and when the voltage of the cathode is higher than that of the anode, no current may be generated. A first network, a second network and a fourth network in the application all have the unidirectional conductivity.

Serial connection in the same direction is as follows: two or more two-terminal networks are connected in series, wherein at least two two-terminal networks have the unidirectional conductivity, and may still have the unidirectional conductivity after being connected in series. Positions of all the two-terminal networks in the application may be subjected to permutated combinations which are not enumerated in the embodiments and drawings. The various permutated combinations shall all fall within the scope of protection of the application.

Serial connection in the same direction in this embodiment is as follows: the diodes have the unidirectional conduction characteristics, meaning that the cathode of one diode is connected with the anode of the other diode, so that the serially connected two-terminal networks still have the unidirectional conductivity except that the conducting voltage drop is equal to a sum of the original conducting voltage drops of the two diodes. By such serial connection, even if the positions of the two diodes are switched, they still have the unidirectional conductivity, and the withstand voltage is the sum of the withstand voltages of the two diodes. FIG. 2-3 shows another mode of serial connection.

The first diode D adopts a diode having the withstand voltage greater than the peak value of the alternating current. In consideration that forward conduction works under the high frequency of the switching power supply, a fast recovery rectifying diode may be adopted, such as 1N4007 having the withstand voltage of 1,000 V, or SF106 having the withstand voltage of 400 V. After the diode is connected in series into the circuit, the first diode D achieves a protective effect, and after the original instantaneous alternating current passes through the rectifying bridge, most of the original instantaneous alternating current is applied to two ends of the LED to avoid the reverse breakdown of the LED.

Figure 11:
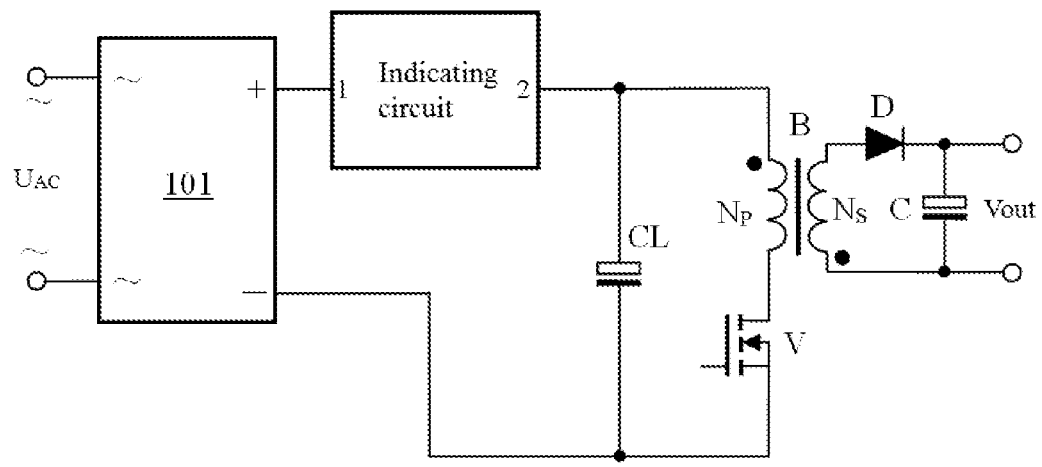
FIG. 11 is a circuit diagram of a use method I in the technical solution.

The second embodiment is arranged into the switching power supply, as shown in FIG. 11, and is similar to FIG. 4 of the first embodiment. The pin 1 of the indicating circuit is the first terminal, and the pin 2 of the indicating circuit is the second terminal. The working principle is the same as that of the first embodiment, thereby also achieving the invention objective.

Figure 12:
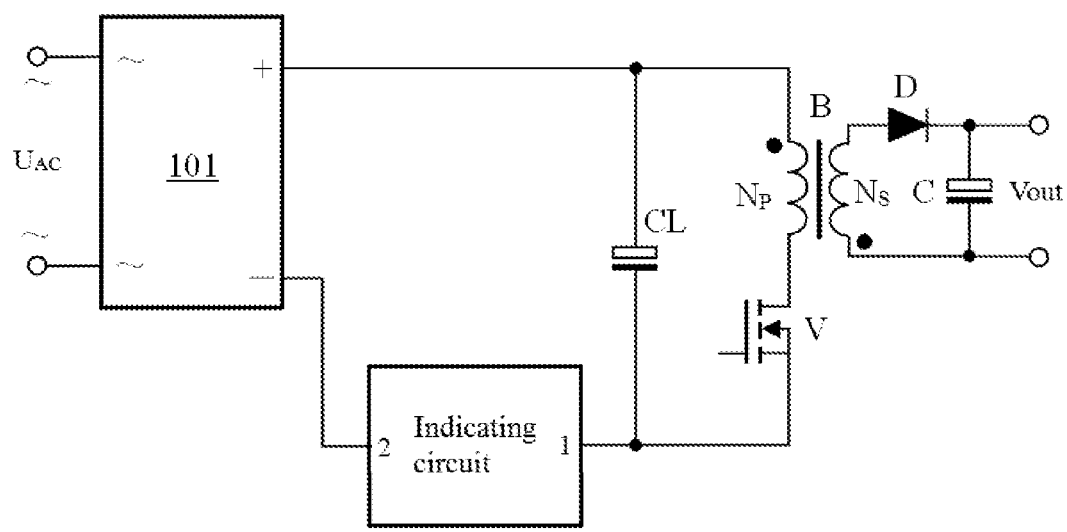
FIG. 12 is a circuit diagram of a use method II in the technical solution.

FIG. 12 is another implementation mode, which also achieves the invention objective. FIG. 11 and FIG. 12 may both accord with the use method: breaking the charging loop between the rectifying bridge and the electrolytic capacitor for filtering in the fly-back power supply is, and inserting the indicating circuit, ensuring that the low-frequency pulsating direct current for charging flows into the indicating circuit from the first terminal and flows out of the indicating circuit from the second terminal, and also ensuring that the excitation current of the main power stage of the fly-back power supply does not directly pass through the indicating circuit.

In case of relatively high power of the switching power supply, or relatively low working voltage, the excitation current of the main power stage is relatively high. At this time, in FIG. 10, the current of the freewheeling path 2 is possibly too high, and common LEDs and light emitters in photocouplers are easy to damage because their maximum bearable current is generally about 50 mA. Therefore, a third embodiment is to solve this problem.

Third Embodiment

With reference to FIG. 2-4, on the basis of the second embodiment, the corresponding solution III further includes a first resistor R. A connection relation is as follows: the first diode D, the first light emitting diode LED and the first resistor R are connected in series in the same direction to form a second network; the second network is connected in parallel with the first inductor L. A connection point of the cathode of the second network and the inductor L forms the first terminal 1; and a connection point of the anode of the second network and the inductor forms the second terminal 2.

Even if the three devices are connected in series, the unidirectional conduction characteristic is still realized. There are six serial connection modes according to a permutated combination method, and they will not be described one by one here.

The third embodiment is arranged into the switching power supply, as shown in FIG. 11 or FIG. 12, and is similar to FIG. 4 of the first embodiment. The pin 1 of the indicating circuit is the first terminal, and the pin 2 of the indicating circuit is the second terminal. The working principle is the same as that of the first embodiment, thereby also achieving the invention objective.

Due to a current limiting resistor R, in case of relatively high power of the switching power supply, or relatively low working voltage, the excitation current of the main power stage is relatively high. At this time, in FIG. 10, the current of the freewheeling path 2 is possibly too high, so that if there is no current limiting resistor R, common LEDs and light emitters in photocouplers are easy to damage because their maximum bearable current is generally about 50 mA, and the current limiting resistor R in the third embodiment is to solve this problem.

Two of the diodes in the rectifying bridge may be conducted at the same time only when the input alternating current is close to the peak value, thereby determining that the current of the LED is high-frequency current repeated at a certain low-frequency cycle instead of direct current. The low-frequency cycle is a frequency obtained after the alternating current is rectified, and is twice the frequency of the alternating current. The cycle of the high-frequency current is the working frequency of the switching power supply. Therefore, when the LED is replaced by a light emitter in the photocoupler, the output current of the photocoupler also appears periodically, and is not a stable signal, which may make troubles for the subsequent circuit. Therefore, a fourth embodiment provides a solution.

Fourth Embodiment

With reference to FIG. 2-5, on the basis of the third embodiment, the corresponding solution IV further includes a first capacitor C. A connection relation is as follows:

the first light emitting diode LED and the first resistor R are connected in series and then are connected in parallel with the first capacitor C to form a third network which then is connected in series with the first diode D in the same direction to form a fourth network; the fourth network is connected in parallel with the first inductor L; a connection point of the cathode of the fourth network and the inductor L forms the first terminal 1; and a connection point of the anode of the fourth network and the inductor L forms the second terminal 2.

The third network is as follows: the LED and the resistor R are connected in series, and then are connected in parallel with the capacitor C. As the capacitor may insulate direct current and connect alternating current, the third network still has the unidirectional conduction characteristic under the direct current. The end where the direct current flows out is the cathode, and the end where the direct current flows in is the anode. Therefore, it is better to understand that the third network still has the unidirectional conductivity after being connected in series with the diode D in the same direction.

Four connection methods are provided in the fourth embodiment, and all may achieve the invention objective. FIG. 2-6 shows another circuit formed by connecting the third network with the diode D in series in the same direction. There are also two methods for connecting the first light emitting diode LED with the first resistor R in series, and the methods will not be shown one by one here.

The fourth embodiment is arranged into the switching power supply, as shown in FIG. 11 or FIG. 12, and is similar to FIG. 4 of the first embodiment. The pin 1 of the indicating circuit is the first terminal, and the pin 2 of the indicating circuit is the second terminal. The working principle is substantially the same as that of the first embodiment. The current generated by the freewheeling current path 2 is first filtered by the capacitor, and then is supplied to the LED through the current limiting resistor R, so that the LED obtains smooth direct current, and may emit light stably without flickering. If the wire of the LED is relatively long, the wire may not cause high-frequency current radiated to the space, thereby improving the radiation disturbance of the switching power supply and reducing EMI (Electro-Magnetic Interference).

When the LED is replaced by a light emitter in the photocoupler, output current of the photocoupler is also a stable signal which may not make troubles for the subsequent circuit. When the collector electrode of the output end of the photocoupler is connected with a pull-up resistor, and the electrolytic capacitor CL is on the edge of failure, the collector electrode of the output end of the photocoupler may output a low level, and when the emitting electrode of the output end of the photocoupler is connected with a pull-down resistor, and the electrolytic capacitor CL is on the edge of failure, the emitting electrode of the output end of the photocoupler may output a high level, so as to inform a subsequent intelligent circuit to take actions, such as sounding an alarm, or automatically switching to another switching power supply, or displaying the level to a screen, and a failure time length of the switching power supply may be indicated according to the size of the current output from the output end of the photocoupler, so as to notify a user to make a further preferred selection of an optimal solution.

Or the LED remains, and two ends of the filter capacitor Cl are then connected in parallel with a fifth network which is formed by connecting a second resistor with an LED2 in the photocoupler in series. Therefore, both light notifying and a low or high level output may be realized.

Therefore, the fourth embodiment may also achieve the invention objective.

By virtue of the inductance, a section of lead wire may be used as the first inductor L on a circuit board, and may also work normally. Of course, during design of the circuit board, this section of lead wire may be routed on the circuit board according to an inductance mode, thereby increasing the inductance and also achieving the invention objective.

According to the first embodiment to the fourth embodiment, if the LED is replaced by the light emitter of the photocoupler, the indicating circuit may realize an electrical isolation function with the help of the electrical isolation function of the photocoupler. If the LED lamp is directly used, as it is often mounted on a panel, in all the use methods in FIG. 4, FIG. 11 and FIG. 12, the LED lamp is electrically connected, and may not be isolated from the alternating current, so that there is a risk that the user touches the LED lamp, resulting in potential hazard in the aspect of the safety standard.

Therefore, four embodiments below of the present application realize the electrical isolation function for the LED.

Fifth Embodiment

With reference to FIG. 3-1, the corresponding solution V realizes a function of isolating an LED lamp from alternating current, and includes a first terminal 1, a second terminal 2, a first transformer B and a first light emitting diode LED. The first transformer B at least includes a primary winding and a secondary winding. The first light emitting diode LED is connected in parallel with the secondary winding of the first transformer B, and the terminal, which is connected with the cathode of the first light emitting diode LED, of the secondary winding is used as a dotted terminal. The end having a black dot in FIG. 3-1 is the marker of the dotted terminal. The corresponding dotted terminal of the primary winding is used as the first terminal 1, and the other end of the primary winding is used as the second terminal 2.

In various documents, only the transformer has the primary winding and the secondary winding. The technical solutions of the application only include the same transformer having the same functions, so that unless otherwise specified, the primary winding and the secondary winding are both windings of the first transformer B.

The indicating circuit of the fifth embodiment is arranged into the switching power supply, as shown in FIG. 11 or FIG. 12. The pin 1 of the indicating circuit is the first terminal, and the pin 2 of the indicating circuit is the second terminal. The fifth embodiment is an isolation version of the first embodiment, so that the working principle is slightly different.

The working principle of the fifth embodiment is slightly complicated. The path of charging current generated by the rectifying bridge 101 is similar to that as shown in FIG. 5. The inductor L is the primary winding of the transformer. As the charging current is a low-frequency current, the charging current varies slowly. During use, the transformer B is a high-frequency transformer, or even a current transformer, the primary winding of which is relatively low in inductance. The primary winding is called primary side for short below. A voltage drop generated on the primary side of the transformer B by the charging current is extremely small, only less than 4.9 mV. This voltage induced to the secondary winding through the transformer B is related to a turn ratio. If the turn ratio is 1:10, the induced voltage of the secondary winding is far less than 49 mV because the transformer B is the high-frequency transformer during use, which is high in leakage inductance in a low-frequency stage, resulting in extremely low initial permeability and extremely low energy transmission efficiency of a magnetic core. Furthermore, if the end marked by the dotted terminal is positive, the LED is in reversal of biasing, and does not emit light. As the induced voltage of the secondary winding is too low, the LED may not be broken down.

The excitation current $i_M$ of the main power stage is also as shown in FIG. 6. Only a very small part of the discharging current of the electrolytic capacitor CL to the main power stage flows through the transformer B. The induced voltage of the secondary winding of the transformer B is far less than the forward conduction voltage of the LED, so that the LED does not emit light.

When the ESR of the electrolytic capacitor CL has risen to 5.5Ω from the qualified 0.5Ω, namely the electrolytic capacitor CL is on the edge of failure, and the inductance of the primary side of the transformer B is still 4.7 uH. Then, under the same condition, the primary side of the transformer B also has an excitation current when the rectifying bridge 101 is conducted, with a peak value of 0.486× 816=397 mA. The peak value appears at the time point $t_1$ or $t_2$ in FIG. 6, namely before the moment that the switching transistor V is changed from the conducting state into the switched off state. As the current in the inductor may not be changed abruptly, the current of 397 mA in the primary side inductor of the transformer B would continuously flow forwards. If the ESR of the electrolytic capacitor CL has risen to 5.5Ω, a voltage drop generated by the current of 397 mA on the ESR is $$U=IR=397\ mA\times5.5\Omega=2.18\ V.$$

Figure 13:
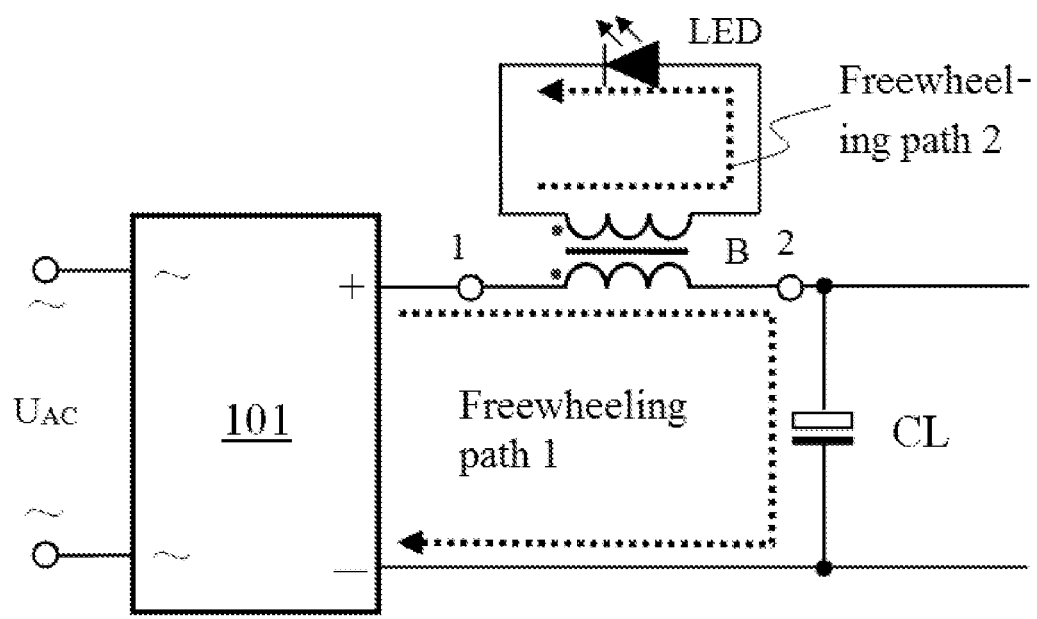
FIG. 13 is a schematic diagram of a working principle of a fifth embodiment corresponding to the solution V realizing an isolation function.

With reference to FIG. 13, the voltage of the second terminal 2 is 2.18 V higher than that of the first terminal 1, so that the induced voltage of the secondary winding of the transformer B having the dotted terminal is also lower, namely the voltage of the anode of the LED is higher than that of the cathode. Even if the turn ratio of the transformer B is as low as 1:1, the LED emits light because of the forward induced voltage of the secondary winding of the transformer B, thereby forming current as shown in the freewheeling path 2 in FIG. 13.

Another way to understand the working principle of the fifth embodiment which adopts the transformer B for isolation is as follows: before the moment that the switching transistor V is changed from the conducting state into the switched off state, as the current in the inductor may not be changed abruptly, the current which has reached the peak value in the primary side inductor of the transformer B would continuously flow forwards, and the ESR of the electrolytic capacitor CL has risen, and may not well absorb the excitation current of the primary side inductor of the transformer B. This current flows from the dotted terminal to the non-dotted terminal. At this time, the transformer B is operated as an energy storage inductor, and the part, which may not be absorbed, in the current may flow from the dotted terminal to the non-dotted terminal inside the secondary winding, thereby faulting current as shown in the freewheeling path 2 in FIG. 13. This is similar to the working principle of the fly-back power supply that it is the current driving the LED to emit light.

After being arranged into FIG. 11 or FIG. 12 according to requirements in the technical solution, the fifth embodiment, namely the indicating circuit in FIG. 3-1, may work normally.

The fifth embodiment realizes isolation from the alternating current, and also achieves the invention objective. At the electrification moment of the switching power supply, it is most possible that the alternating current is in a high-voltage state instead of a zero volt state. As the end voltage of the electrolytic capacitor CL is zero, and may not be changed abruptly, the current in the primary side inductor of the transformer B is zero, and may not be changed abruptly. At the electrification moment, most of the instantaneous alternating current may be applied to two ends of the primary side of the transformer B, so that the induced voltage of the secondary side reversely breaks down the LED. Therefore, a sixth embodiment is to solve this problem.

Sixth Embodiment

With reference to FIG. 3-2, on the basis of the fifth embodiment, the corresponding solution VI further includes a first diode D. A connection relation is as follows: the first diode D is connected in series with the first light emitting diode LED in the same direction to form a first network which is connected in parallel with the secondary winding of the first transformer B. Furthermore, the terminal, which is connected with the cathode, of the secondary winding is used as a dotted terminal. The corresponding dotted terminal of the primary winding is used as the first terminal 1, and the other terminal of the primary winding is used as the second terminal 2.

FIG. 3-3 shows another mode of serial connection in the same direction.

The sixth embodiment is an isolation version of the second embodiment. The working principle for preventing reverse breakdown is introduced in the second embodiment, so that no more details will be described here. The sixth embodiment also achieves the invention objective. After being arranged into FIG. 11 or FIG. 12 according to the requirements in the technical solution, the sixth embodiment, namely the indicating circuit as shown in FIG. 3-2 or FIG. 3-3, may work normally. Similarly, due to no current limiting resistor, the LED or the light emitter in the photocoupler is easy to damage. Therefore, a seventh embodiment is to solve this problem.

Seventh Embodiment

With reference to FIG. 3-4, on the basis of the sixth embodiment, the corresponding solution VII further includes a first resistor R. A connection relation is as follows: the first diode D, the first light emitting diode LED and the first resistor R are connected in series in the same direction to form a second network which is connected in parallel with the secondary winding of the first transformer B. Furthermore, the terminal, which is connected with the cathode of the second network, of the secondary winding is used as a dotted terminal. The corresponding dotted terminal of the primary winding is used as the first terminal 1, and the other terminal of the primary winding is used as the second terminal 2.

The seventh embodiment is an isolation version of the third embodiment. Even if the three devices are connected in series in the same direction, the unidirectional conduction characteristic must be realized. There are six serial connection modes according to a permuted combination method, and the modes will not be shown one by one here. After being arranged into FIG. 11 or FIG. 12 according to the requirements in the technical solution, the seventh embodiment may work normally.

Similar to the final reason of the third embodiment, when the LED is replaced by the light emitter in the photocoupler, the output current of the photocoupler also appears periodically, which is not a stable signal and would make troubles for the subsequent circuit. Therefore, an eighth embodiment provides a solution.

Eighth Embodiment

With reference to FIG. 3-5, on the basis of the seventh embodiment, the corresponding solution VIII further includes a first capacitor C. A connection relation is as follows:

the first light emitting diode LED and the first resistor R are connected in series, and then are connected in parallel with the first capacitor C to form a third network which is connected in series with the first diode D in the same direction to form a fourth network; and the fourth network is connected in parallel with the secondary winding of the first transformer B. Furthermore, the terminal, which is connected with the cathode of the fourth network, of the secondary winding is used as a dotted terminal. The corresponding dotted terminal of the primary winding is used as the first terminal 1, and the other terminal of the primary winding is used as the second terminal 2.

The eighth embodiment is an isolation version of the fourth embodiment. The filtering working principle is the same as that of the fourth embodiment. The eighth embodiment provides four connection methods which may all achieve the invention objective. FIG. 3-6 shows another circuit in which the third network is then connected in series with the diode D in the same direction. There are also two methods for serial connection between the first light emitting diode LED and the first resistor R, and the methods will not be shown one by one here.

The eighth embodiment is arranged into the switching power supply, as shown in FIG. 11 or FIG. 12, to also achieve the invention objective.

According to the fifth embodiment to the eighth embodiment, the LED lamp is directly used, and is mounted on the panel. The LED lamp is not electrically connected, and is isolated from the alternating current, thereby meeting the requirements of the safety standard.

The transformer B may be a current transformer. According to actual measurement, even if the primary side includes one turn, the transformer B may also work, so as to reduce the cost of the current transformer. A low-cost solution is that holes are formed in two sides of one lead wire on a circuit board, and are clamped with an EI or CC type magnetic core including a coiled secondary winding, so as to directly realize the function of the transformer B.

In the embodiments 1 to 8, if one high-frequency capacitor is connected in parallel between the positive and negative of the output of the rectifying bridge, when the rectifying bridge is not conducted, the inductor L or the transformer B may participate in excitation after the ESR of the electrolytic capacitor CL is increased, so that the circuit performance of the present application is improved.

The above descriptions are only preferred implementation modes of the present application. It should be noted that the above-mentioned preferred implementation modes shall not be deemed as limitations to the present application. Ordinary persons skilled in the art can further make a plurality of improvements and embellishments, such as connecting a resistor in series into the first diode, without departing from the spirit and scope of the present application. These improvements and embellishments shall fall within the scope of protection of the present application, and no more embodiments will be described here. The scope of protection of the present application shall be based on the scope defined by claims.

What is claimed is:

1. An indicating circuit for a switching power supply, comprising a first terminal, a second terminal, a first transformer and a first light emitting diode, the first transformer at least comprises a primary winding and a secondary winding; the first light emitting diode is connected in parallel with the secondary winding of the first transformer, and one terminal, which is connected with the cathode of the first light emitting diode, of the secondary winding is used as a dotted terminal; a corresponding dotted terminal of the primary winding is used as the first terminal; and the other terminal of the primary winding is used as the second terminal, wherein the indicating circuit further comprising:
a first diode, wherein a connection relation is as follows: the first diode is connected in series with the first light emitting diode in the same direction to form a first network; the first network is connected in parallel with the secondary winding of the first transformer, and the one terminal, which is connected with the cathode, of the secondary winding is used as a dotted terminal; the corresponding dotted terminal of the primary winding is used as the first terminal; and the other terminal of the primary winding is used as the second terminal,
a first resistor, wherein a connection relation is as follows: the first diode, the first light emitting diode and the first resistor are connected in series in the same direction to form a second network; the second network is connected in parallel with the secondary winding of the first transformer, and the one terminal, which is connected with the cathode of the second network, of the secondary winding is used as a dotted terminal; the corresponding dotted terminal of the primary winding is used as the first terminal; and the other terminal of the primary winding is used as the second terminal,
a first capacitor, wherein a connection relation is as follows: the first light emitting diode and the first resistor are connected in series, and then are connected in parallel with the first capacitor to form a third network which is then connected in series with the first diode in the same direction to form a fourth network; the fourth network is connected in parallel with the secondary winding of the first transformer, and the one terminal, which is connected with the cathode of the fourth network, of the secondary winding is used as a dotted terminal; the corresponding dotted terminal of the primary winding is used as the first terminal; and the other terminal of the primary winding is used as the second terminal.

2. The indicating circuit for the switching power supply according to claim 1, wherein the primary winding of the first transformer is a section of lead wire on a circuit board.

3. The indicating circuit for the switching power supply according to claim 1, wherein the first light emitting diode is a light emitter in a photocoupler.

4. The indicating circuit for the switching power supply according to claim 1, further comprising a second resistor which is connected in parallel to two ends of the first light emitting diode.

5. A method for using the indicating circuit for the switching power supply according to claim 1, comprising: breaking a charging loop between a rectifying bridge and an electrolytic capacitor for filtering in a fly-back power supply, and inserting the indicating circuit and ensure that low-frequency pulsating direct current for charging flows into the indicating circuit from the first terminal and flows out of the indicating circuit from the second terminal, and also ensure that an excitation current of a main power stage of the fly-back power supply does not directly pass through the indicating circuit.

* * * * *